United States Patent [19]

Hirakawa

[11] Patent Number: 4,961,104
[45] Date of Patent: Oct. 2, 1990

[54] MULTI-LEVEL WIRING STRUCTURE OF SEMICONDUCTOR DEVICE

[75] Inventor: Noboru Hirakawa, Tokyo, Japan

[73] Assignee: NEC Corporation, Tokyo, Japan

[21] Appl. No.: 185,742

[22] Filed: Apr. 25, 1988

[30] Foreign Application Priority Data

Apr. 24, 1987 [JP] Japan .................... 62-102413

[51] Int. Cl.[5] ........................................ H01L 23/48
[52] U.S. Cl. ..................................... 357/71; 357/51; 357/59
[58] Field of Search .................. 357/71, 67; 437/162, 437/187

[56] References Cited

U.S. PATENT DOCUMENTS

| | | | |
|---|---|---|---|
| 4,451,841 | 5/1984 | Hori et al. | 357/71 P |
| 4,507,852 | 4/1985 | Karulkar | 357/67 |
| 4,514,233 | 4/1985 | Kawabuchi | 437/187 |
| 4,523,372 | 6/1985 | Balda et al. | 357/71 |
| 4,533,935 | 8/1985 | Mochizuki | 357/71 |
| 4,547,260 | 10/1985 | Takada et al. | 357/67 |
| 4,618,878 | 10/1986 | Aoyama et al. | 357/71 |
| 4,673,969 | 6/1987 | Ariizumi et al. | 357/71 |
| 4,735,916 | 4/1988 | Homma et al. | 437/162 |
| 4,754,318 | 6/1988 | Momose et al. | 357/71 |
| 4,785,342 | 11/1988 | Yamanaka et al. | 357/71 |
| 4,800,176 | 1/1989 | Kakumu et al. | 357/71 |

FOREIGN PATENT DOCUMENTS

| | | |
|---|---|---|
| 56-161668 | 12/1981 | Japan . |
| 57-56958 | 4/1982 | Japan . |
| 58-213449 | 12/1983 | Japan . |
| 59-111344 | 6/1984 | Japan . |
| 59-161049 | 9/1984 | Japan . |
| 60-49651 | 3/1985 | Japan ................. 357/71 |
| 60-85542 | 5/1985 | Japan . |
| 60-178643 | 9/1985 | Japan . |
| 61-148877 | 7/1986 | Japan . |

Primary Examiner—Andrew J. James
Assistant Examiner—Viet Q. Nguyen
Attorney, Agent, or Firm—Sughrue, Mion, Zinn, Macpeak & Seas

[57] ABSTRACT

For preventing a thin wiring layer from destruction, a multi-level wiring structure incorporated in a semiconductor device is fabricated on a semiconductor substrate. It includes a first insulating layer formed on the semiconductor substrate, a first-level wiring layer of a first conductive material formed on the first insulating layer, a second insulating layer of a first insulating material covering the first-level wiring layer and having a first contact opening partially exposing the first-level wiring layer, a high-resistive second wiring layer formed on the second insulating layer in such a manner as to contact with the first-level wiring layer through the first contact opening and having a small thickness, a third insulating layer covering the high-resistive second wiring layer and having a second contact opening nested with respect to the first contact opening and partially exposing the high-resistive second wiring layer, and a third wiring layer formed on the third insulating layer in such a manner as to contact with the high-resistive second wiring layer through the second contact opening, wherein an etchant used for formation of the second contact opening has an etching rate for the first conductive material smaller than that for the first insulating material.

6 Claims, 2 Drawing Sheets

MULTI-LEVEL WIRING STRUCTURE OF SEMICONDUCTOR DEVICE

FIELD OF THE INVENTION

This invention relates to a semiconductor device and, more particularly, to a multi-level wiring structure incorporated in a semiconductor device.

BACKGROUND OF THE INVENTION

Research and development efforts are being made for reduction in minimum device dimension to increase the integration density of component elements fabricated on a single semiconductor substrate, and a multi-level wiring structure tends to be employed in a semiconductor device for the same purpose. For example, a static random access memory device has a memory cell arrangement formed by a flip-flop circuit, and the flip-flop circuit is usually provided with two load resistors coupled between a source of voltage and switching transistors arranged in a cross-coupled manner. It is preferable for the load resistors to have a large resistance for the sake of reduction in power consumption, so that thin and narrow polysilicon layers are formed as a second level of the multi-level wiring structure so as to provide the resistors of the flip-flop circuit. The resistors need to be supplied with an electric power, and an aluminum wiring layer is formed over the resistors as a third level of the multi-level wiring structure contacting through contact holes formed in an insulating film between the second and third levels. Namely, as shown in FIG. 1, the high resistive polysilicon layers 1 are formed over a semiconductor substrate 2 overlain by a first insulating film 3 of, for example, silicon dioxide, and a second insulating film 4 of silicon dioxide is deposited on the entire surface of the structure as shown in FIG. 1 of the drawings. Contact holes 5 are formed in the second insulating film 4 to partially expose the respective high resistive polysilicon layers 1, and, thereafter, aluminum is deposited on the second insulating film 4 to form contacts between the aluminum layer 6 and the polysilicon layers 1.

However, a problem is encountered in the fabrication process of the multi-level structure in over-etching of the insulating material. In detail, when the etching process is applied to the second insulating film 4 for formation of the contact holes 5, the etching gaseous mixture tends to pass through the thin polysilicon layers and continues to etch the first insulating film 3 to form cavities 7 underneath the polysilicon layers. This is because of the fact that the polysilicon layers 1 have a lot of grain boundaries through which the etching gaseous mixture flows. If the polysilicon layers 1 are small in thickness of about 1000 angstroms, the over-etching problem is serious, and there is a possibility to break the polysilicon layers. If the cavities are formed in the first insulating layer 3, the contacts between the aluminum layer and the polysilicon layers 1 are liable to be broken, which results in deterioration in production yield.

SUMMARY OF THE INVENTION

It is therefore an important object of the present invention to provide a multi-level wiring structure which is free from the over-etching problem inherent in the prior-art wiring structure.

To accomplish these objects, the present invention proposes to provide a protection material covering that area under the contact hole.

In accordance with one aspect of the present invention, there is provided a multi-level wiring structure incorporated in a semiconductor device fabricated on a semiconductor substrate, a first insulating layer formed on the semiconductor substrate, a first-level wiring layer of a first conductive material formed on the first insulating layer, a second insulating layer of a first insulating material covering the first-level wiring layer and having a first contact opening exposing a central area of an upper surface of the first-level wiring layer, a high-resistive second wiring layer formed on the second insulating layer in such a manner as to contact with the first-level wiring layer through the first contact opening and having a small thickness, a third insulating layer covering the high-resistive second wiring layer and having a second contact opening nested with respect to the first contact opening and partially exposing the high-resistive second wiring layer, and a third wiring layer formed on the third insulating layer in such a manner as to contact with the high-resistive second wiring layer through the second contact opening, has an etching rate for the first conductive material smaller than that for the first insulating material.

The high-resistive second wiring layer may be formed of polysilicon having a thickness equal to or less than about 1500 angstroms, and the first-level wiring layer and the second and third insulating layers may be formed of polysilicon and silicon dioxide, respectively. In this implementation, the etchant may be $CF_4$-containing gaseous mixture.

BRIEF DESCRIPTION OF THE DRAWINGS

The features and advantages of a multi-level wiring structure according to the present invention will be more clearly understood from the following description taken in conjunction with the accompanying drawings in which.

DESCRIPTION OF THE PREFERRED EMBODIMENTS

First Embodiment

Figure 1:
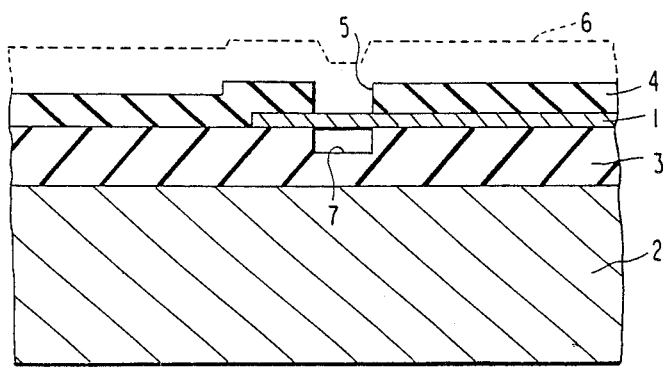
FIG. 1 is a cross sectional view showing a prior-art multi-level wiring structure employed in a semiconductor memory device.
Figure 2:
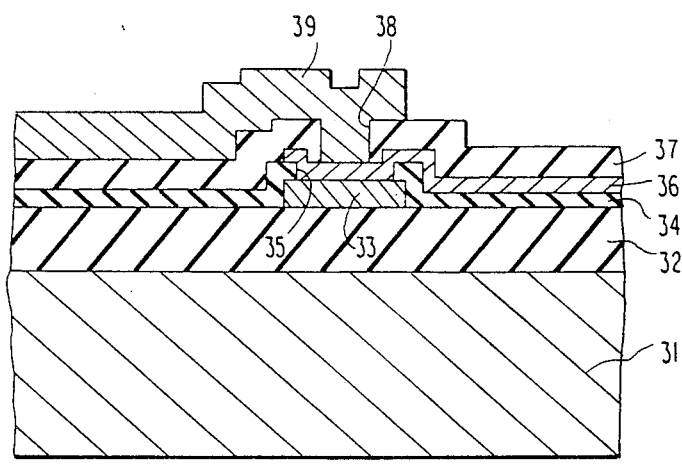
FIG. 2 is a cross sectional view showing a multi-level wiring structure embodying the present invention.
Figure 3:
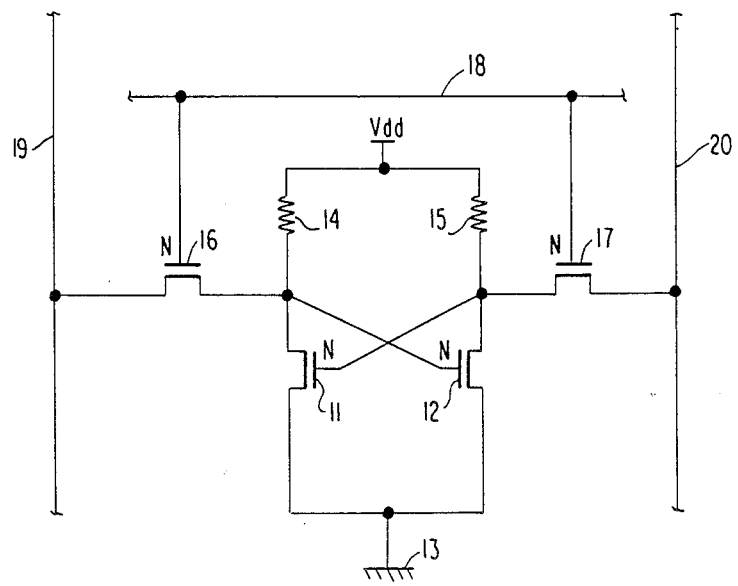
FIG. 3 Is a diagram showing the circuit arrangement of a static type random access memory device to which the present invention is applicable.

Referring first to FIG. 2 of the drawings, there is shown a multi-level wiring structure embodying the present invention, and the multi-level wiring structure is applied to a part of a static type random access memory cell illustrated in FIG. 3. The static type random access memory cell largely comprises first and second n-channel type field effect transistors 11 and 12 coupled at source nodes thereof to a ground terminal 13, first and second resistors 14 and 15 with a large resistance coupled between a source of positive voltage level Vdd and drain nodes of the first and second n-channel type field effect transistors 11 and 12, respectively, and first and second switching transistors 16 and 17 gated by a word line 18 and coupled between a pair of bit lines 19 and 20 and respective drain nodes of the first and second n-channel type field effect transistors 11 and 12, respectively. The n-channel type field effect transistor 11 has gate electrode coupled to the drain node of the second n-channel type field effect transistors 12, and the second n-channel type field effect transistors 12 has gate electrodes coupled to the drain node of the first n-channel type field effect transistor 11. The static type random access memory cell thus cross coupled alternatively switches the first and second n-channel type field effect transistors 11 and 12 depending upon a data bit appearing at the bit lines 19 and 20 and preserves the bit of data information as a difference in voltage level between the two drain nodes. One of the n-channel type field effect transistors 11 and 12 is turned on to provide a conduction path between the source of positive voltage Vdd and the ground node 13, so that the static type random access memory cell illustrated in FIG. 3 consumes an electric power to maintain the bit of data information. For this reason, each of the resistors 14 and 15 has a large resistance to reduce the power consumption and is formed in a multi-level wiring structure as shown in FIG. 2 for increasing an integration density.

Both of the resistors 14 and 15 are similar in structure to each other, so that description will be made for the resistor 14 only with reference to FIG. 2 of the drawings. Reference numeral 31 designates a single crystal p-type silicon substrate, and the silicon substrate 31 is overlain by a first insulating film 32 of, for example, silicon dioxide. Though not shown in the drawings, the n-channel type field effect transistors 11, 12, 16 and 17 are formed in the silicon substrate 31 and interconnections are provided for couplings. On the first insulating film 32 is formed a first level wiring layer 33 of, for example, polysilicon which provides an interconnection between the resistor 14 and the drain node of the n-channel type field effect transistor 11. The first level wiring layer 33 is covered with silicon dioxide forming a second insulating film 34, and a first contact hole 35 is formed in the second insulating film 34 in such a manner as to expose a part of the first level wiring layer 33. A thin and narrow second level high-resistive layer 36 of, for example, polysilicon is formed on the second insulating film 34 and contacts with the first level wiring layer 33 through the first contact hole 35. In this instance, the second level high-resistive layer 36 has a thickness of about 1000 angstroms. However, the second level high-resistive layer 36 may be selected to have a thickness equal to or less than 1500 angstroms, and the first level wiring layer serving as a protective material is effective in the multi-level structure with the second level layer of such a small thickness.

A third insulating film 37 is formed on the second level high-resistive layer 36 and is formed with a second contact hole 38. The second contact hole 38 is smaller in area than the first contact hole 35 and nested with respect to the first contact hole 35. In this instance, the third insulating film 37 is formed of silicon dioxide, so that CF$_4$-containing gaseous mixture is used as an etchant during formation of the second contact hole 38. CF$_4$-containing gaseous mixture is effective to etch away silicon dioxide but has a smaller etching rate with respect to polysilicon, typically 1/10. For this reason, the first level wiring layer of polysilicon 33 prevents the first insulating film 32 of silicon dioxide from removal caused by the etchant used during the formation of the second contact hole 38.

On the third insulating film 37 is formed an aluminum wiring layer which has a lug portion passing through the second contact hole 38 to contact with the second level high-resistive layer 36. The aluminum wiring layer 39 provides an interconnection between the source of positive voltage Vdd and the resistor 14.

In this instance, the first and second contact holes are formed in the different steps, respectively, however it is possible to simultaneously form the first and second contact holes.

Second Embodiment

Figure 4:
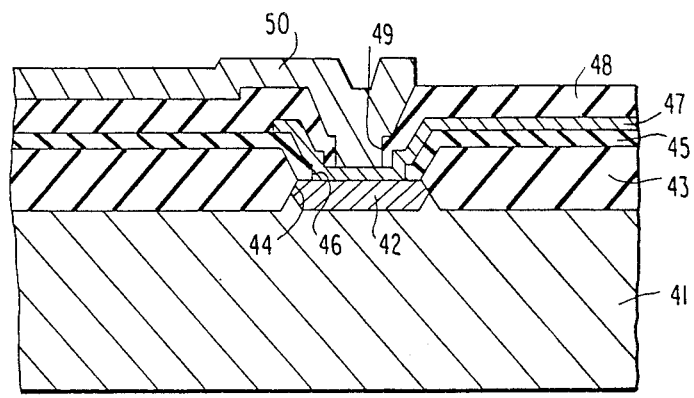
FIG. 4 is a cross sectional view showing another multi-level wiring structure embodying the present invention.

Turning to FIG. 4 of the drawings, another multi-level wiring structure is illustrated. The multi-level wiring structure is formed on a single crystal p-type silicon substrate 41 which is partially removed to form an n-type land portion 42. In this instance, the n-type land portion 42 is formed by lithographic process followed by an ion implantation. The land portion 42 thus formed is electrically isolated from the remaining silicon substrate 41 by the p-n junction formed therebetween. On the silicon substrate 41 is formed a first insulating film 43 of, for example, silicon dioxide which has an opening 44 exposing the land portion 42. The first insulating film 43 is covered with silicon dioxide which forms a second insulating film 45, and a first contact hole 46 is formed in the second insulating film 45, exposing the land portion 42. A thin and narrow high-resistive layer 47 is formed on the second insulating film 45 and contacts with the land portion 42 through the first contact hole 46. In this instance, the n-type land portion serves as a protective material. The thin and narrow high-resistive layer 47 is covered with silicon dioxide forming a third insulating film 48 where a second contact hole 49 is formed to partially expose the high-resistive layer 47. The second contact hole 49 is smaller in area than the first contact hole 46 and nested with respect to the first contact hole 46. During formation of the second contact hole 49, CF$_4$-containing gaseous mixture is used as an etchant to selectively remove silicon dioxide, and the etchant has a small etching rate to the single crystal silicon forming the land portion 42. Then, the land portion 42 is not etched away during formation of the second contact hole 49, thereby preventing the thin and narrow high-resistive layer 47 from destruction. An aluminum wiring layer 50 is provided on the third insulating layer 48 and contacts with the high-resistive layer 47.

Although particular embodiment of the present invention have been shown and described, it will be obvious to those skilled in the art that various changes and modifications may be made without departing from the spirit and scope of the present invention.

What is claimed is:

1. A multi-level wiring structure incorporated in a semiconductor device fabricated on a semiconductor substrate, comprising:
   (a) a first insulating layer formed on said semiconductor substrate;
   (b) a first wiring layer of a preselected conductive material formed on said first insulating layer;
   (c) a second insulating layer of a preselected insulating material covering said first wiring layer and having a first contact opening exposing a central area of an upper surface of said first wiring layer;

(d) a high-resistive second wiring layer formed on said second insulating layer in such a manner as to contact with said first wiring layer through said first contact opening and having a small thickness;

(e) a third insulating layer covering said high-resistive second wiring layer and having a second contact opening nested with respect to said first contact opening and partially exposing a central area of an upper surface of said high-resistive second wiring layer; and (f) a third wiring layer formed on said third insulating layer in such a manner as to contact with said high-resistive second wiring layer through said second contact opening, wherein an etchant used for formation of said second contact opening has an etching rate for said preselected conductive material smaller than that for said preselected insulating material.

2. A multi-level wiring structure as set forth in claim 1, in which said high-resistive second wiring layer is formed of polysilicon and has a thickness equal to or less than about 1500 angstroms.

3. A multi-level wiring structure as set forth in claim 2, in which said first wiring layer is formed of polysilicon and said second and third insulating layers are formed of silicon dioxide.

4. A multi-level wiring structure as set forth in claim 3, in which said etchant is $CF_4$-containing gaseous mixture.

5. A multi-level wiring structure as set forth in claim 2, in which said high-resistive second wiring layer provides resistor forming part of a static type random access memory cell.

6. A static random access memory cell fabricated on a semiconductor substrate, comprising a first series combination of a first resistor and a first field effect transistor coupled at one end thereof to a first constant voltage source, a series combination of a second resistor and a second field effect transistor coupled ;at one end thereof to said first constant voltage source, first wiring layers interconnecting a first group comprising the first resistor, the drain node of the first field effect transistor and the gate electrode of the second field effect transistor and a second group comprising the second resistor, the drain node of the second field effect transistor and the gate electrode of the first field effect transistor, respectively, second wiring layers providing the first and second resistors, respectively, and third wiring layers interconnecting a second constant voltage source and the first and second resistors, in which a multi-level wiring structure fabricated on a semiconductor substrate comprises a first insulating layer formed on the semiconductor substrâte, each of the first wiring layers of a preselected conductive material formed on the first insulating layer, a second insulating layer of a preselected insulating material covering each first wiring layer and having a first contact opening exposing a central area of an upper surface of each first wiring layer, each of the second wiring layers formed on the second insulating layer in such a manner as to contact with each of the first wiring layers through the first contact opening and having a small thickness, a third insulating layer covering each second wiring layer and having a second contact opening nested with respect to the first contact opening and partially exposing a central area of an upper surface of each of the second wiring layers, and the third wiring layer formed on the third insulating layer in such a manner as to contact with each of the second wiring layers through the second contact opening, wherein an etchant used for formation of the second contact opening has an etching rate for the preselected conductive material smaller than that for the preselected insulating material.

* * * * *